(12) United States Patent
Liu

(10) Patent No.: US 11,257,850 B2
(45) Date of Patent: Feb. 22, 2022

(54) BACKPLANE STRUCTURE CONTAINING CAPACITOR

(71) Applicant: SHENZHEN CHINA STAR OPTOELECTRONICS SEMICONDUCTOR DISPLAY TECHNOLOGY CO., LTD., Shenzhen (CN)

(72) Inventor: Zhaosong Liu, Shenzhen (CN)

(*) Notice: Subject to any disclaimer, the term of this patent is extended or adjusted under 35 U.S.C. 154(b) by 233 days.

(21) Appl. No.: 16/616,973

(22) PCT Filed: Jun. 28, 2019

(86) PCT No.: PCT/CN2019/093649
§ 371 (c)(1),
(2) Date: Nov. 26, 2019

(87) PCT Pub. No.: WO2020/228106
PCT Pub. Date: Nov. 19, 2020

(65) Prior Publication Data
US 2021/0327908 A1 Oct. 21, 2021

(30) Foreign Application Priority Data
May 14, 2019 (CN) .......................... 201910397566.5

(51) Int. Cl.
*H01L 27/14* (2006.01)
*H01L 27/12* (2006.01)
*H01L 27/32* (2006.01)

(52) U.S. Cl.
CPC ........ *H01L 27/124* (2013.01); *H01L 27/1255* (2013.01); *H01L 27/3265* (2013.01); *H01L 27/3276* (2013.01)

(58) Field of Classification Search
CPC ............... H01L 27/124; H01L 27/1255; H01L 27/3265; H01L 27/3276
(Continued)

(56) References Cited

U.S. PATENT DOCUMENTS

| 9,553,169 B2 * | 1/2017 | Hsu ........................ H01L 27/127 |
| 2016/0247837 A1 | 8/2016 | Shi |

(Continued)

FOREIGN PATENT DOCUMENTS

| CN | 103293790 A | 9/2013 |
| CN | 104064688 A | 9/2014 |

(Continued)

*Primary Examiner* — Tan N Tran
(74) *Attorney, Agent, or Firm* — JMB Davis Ben-David

(57) ABSTRACT

A backplane structure containing a capacitor includes a substrate, a first conductive film disposes on the substrate, a second conductive member having one portion spaced apart from the first conductive film and another portion connected to the first conductive film, a third conductive film spaced apart from the first conductive film and the second conductive member, a fourth conductive member connected to the third conductive film, and a fifth conductive member having one portion connected to the fourth conductive member and another portion spaced apart from the second conductive member. The third conductive film is disposed between the first conductive film and the second conductive member in an insulation manner, and the second conductive member is disposed between the third conductive film, the fourth conductive member, and the fifth conductive member in an insulation manner.

17 Claims, 4 Drawing Sheets

(58) Field of Classification Search
USPC .................................... 257/330, 59, 72, 432
See application file for complete search history.

(56) References Cited

U.S. PATENT DOCUMENTS

2016/0358948 A1    12/2016  Wang
2018/0197897 A1     7/2018  Xin

FOREIGN PATENT DOCUMENTS

| CN | 104576656 A |   | 4/2015  |
|----|-------------|---|---------|
| CN | 108957884 A | * | 12/2018 |
| CN | 108957884 A |   | 12/2018 |
| CN | 109696781 A |   | 4/2019  |

\* cited by examiner

BACKPLANE STRUCTURE CONTAINING CAPACITOR

CROSS-REFERENCE TO RELATED APPLICATIONS

This is the U.S. National Stage of International Patent Application No. PCT/CN2019/093649, filed Jun. 28, 2019, which in turn claims the benefit of Chinese Patent Application No. 201910397566.5 filed May 14, 2019.

FIELD OF INVENTION

The present disclosure relates to the technical field of semiconductor device structures, and specifically to a backplane structure containing a capacitor.

BACKGROUND OF INVENTION

Active matrix organic light emitting diode (AMOLED) display technology has advantages, such as wider color range, self-illumination, thin, light, and fast response speed, which will make pictures more delicate and real in high pixels per inch (PPI) display panels.

Therefore, reducing an area of a single display pixel is of great significance for a high PPI display panel, especially for a bottom emission color filter on array (COA) display scheme.

In an AMOLED pixel driving circuit, one or two capacitors are generally used as a storage capacitor for displaying data signals, in which size of the capacitor directly determines storage capacity of the signals.

However, in the entire pixel driving circuit, an area of the capacitor occupies a considerable proportion. Thus, under a trend of reducing the pixel area and preparing a high PPI display panel, how to reduce the area of the capacitor under a premise of ensuring that the size of the capacitor remains, remains to overcome the related problems.

SUMMARY OF INVENTION

A backplane structure containing a capacitor is provided in the present disclosure to solve a problem of a larger area of a capacitor in the prior art.

In order to achieve the above object, an aspect of the present disclosure provides a backplane structure containing a capacitor, which includes: a substrate; a first conductive film disposed on the substrate; a second conductive member having two portions connected to each other, wherein one of the two portions of the second conductive member is spaced apart from the first conductive film, and the other of the two portions of the second conductive member is connected to the first conductive film; a third conductive film spaced apart from the first conductive film and the second conductive member; a fourth conductive member connected to the third conductive film; and a fifth conductive member having two portions connected to each other, wherein one of the two portions of the fifth conductive member is connected to the fourth conductive member, and the other of the two portions of the fifth conductive member is spaced apart from the second conductive member; wherein the third conductive film is disposed between the first conductive film and the second conductive member in an insulation manner, and the second conductive member is disposed between the third conductive film, the fourth conductive member, and the fifth conductive member in an insulation manner, to form a three-layered capacitance structure; and wherein orthographic projections of the first conductive film, the second conductive member, the third conductive film, and the fifth conductive member are partially overlapped on the substrate.

In an embodiment of the present disclosure, the backplane structure containing the capacitor is disposed in a low temperature polysilicon backplane, which has at least one active matrix organic light emitting diode.

In an embodiment of the present disclosure, the low temperature polysilicon backplane contains N-type or P-type doped low temperature polysilicon.

In an embodiment of the present disclosure, the backplane structure containing the capacitor includes: a light shielding metal film configured as the first conductive film and disposed on the substrate; a buffer barrier layer covering the substrate and the light shielding metal film, wherein the buffer barrier layer has a first through hole communicating with the light shielding metal film; an indium gallium zinc oxide film configured as the third conductive film and disposed on the buffer barrier layer, wherein an orthographic projection of the indium gallium zinc oxide film and an orthographic projection of the light shielding metal film are partially overlapped on the substrate; an interlayer insulation layer covering the indium gallium zinc oxide film and the buffer barrier layer, wherein the interlayer insulation layer has a second through hole and a third through hole, the second through hole communicates with the indium gallium zinc oxide film, and the third through hole communicates with the first through hole; a metal contact configured as the fourth conductive member and disposed on the interlayer insulation layer, wherein the metal contact is electrically connected to the indium gallium zinc oxide film through the second through hole; a metal diaphragm configured as the second conductive member and disposed on the interlayer insulation layer, wherein the metal diaphragm is electrically connected to the light shielding metal film through the third through hole and the first through hole, and an orthographic projection of the metal diaphragm and an orthographic projection of the indium gallium zinc oxide film are partially overlapped on the substrate; a passivation layer covering the interlayer insulation layer, the metal contact, and the metal diaphragm, wherein the passivation layer has a fourth through hole communicating with the metal contact; a planar layer disposed on the passivation layer, wherein the planar layer has a fifth through hole and a sixth through hole, the fifth through hole communicates with the fourth through hole, and the sixth through hole is located over the metal diaphragm; and a first transparent conductive film configured as the fifth conductive member, wherein the first transparent conductive film extends from the fifth through hole to the sixth through hole through the fourth through hole and a partial surface of the planar layer, and is electrically connected to the metal contact.

In an embodiment of the present disclosure, at least one thin film transistor is provided in the interlayer insulation layer and includes: an indium gallium zinc oxide layer disposed on the buffer barrier layer; a gate insulation layer disposed on the indium gallium zinc oxide layer; and a gate metal layer disposed on the gate insulation layer.

In an embodiment of the present disclosure, the interlayer insulation layer covers the indium gallium zinc oxide layer, the gate insulation layer, and the gate metal layer; and wherein the interlayer insulation layer has a seventh through hole and an eighth through hole, and the seventh through hole and the eighth through hole communicate with the indium gallium zinc oxide layer located on two sides of the gate insulation layer.

In an embodiment of the present disclosure, the backplane structure containing the capacitor further includes two metal electrode-plates disposed on the interlayer insulation layer, wherein the two metal electrode-plates are electrically connected to the indium gallium zinc oxide layer located on two sides of the gate insulation layer through the seventh through hole and the eighth through hole.

In an embodiment of the present disclosure, the passivation layer has a ninth through hole communicating with one of the two metal electrode-plates; and the planar layer has a tenth through hole communicating with the ninth through hole.

In an embodiment of the present disclosure, the backplane structure containing the capacitor further includes a second transparent conductive film, wherein the second transparent conductive film extends from the ninth through hole and the tenth through hole to a partial surface of the planar layer, and is electrically connected to one of the two metal electrode-plates.

In order to achieve the above object, another aspect of the present disclosure provides a backplane structure containing a capacitor, which includes: a substrate; a first conductive film disposed on the substrate; a second conductive member having two portions connected to each other, wherein one of the two portions of the second conductive member is spaced apart from the first conductive film, and the other of the two portions of the second conductive member is connected to the first conductive film; a third conductive film spaced apart from the first conductive film and the second conductive member; a fourth conductive member connected to the third conductive film; and a fifth conductive member having two portions connected to each other, wherein one of the two portions of the fifth conductive member is connected to the fourth conductive member, and the other of the two portions of the fifth conductive member is spaced apart from the second conductive member; wherein the third conductive film is disposed between the first conductive film and the second conductive member in an insulation manner, and the second conductive member is disposed between the third conductive film, the fourth conductive member, and the fifth conductive member in an insulation manner.

In an embodiment of the present disclosure, orthographic projections of the first conductive film, the second conductive member, the third conductive film, and the fifth conductive member are partially overlapped on the substrate.

In an embodiment of the present disclosure, the backplane structure containing the capacitor is disposed in a low temperature polysilicon backplane, which has at least one active matrix organic light emitting diode.

In an embodiment of the present disclosure, the low temperature polysilicon backplane contains N-type or P-type doped low temperature polysilicon.

In an embodiment of the present disclosure, the backplane structure containing the capacitor includes a light shielding metal film configured as the first conductive film and disposed on the substrate; a buffer barrier layer covering the substrate and the light shielding metal film, wherein the buffer barrier layer has a first through hole communicating with the light shielding metal film; an indium gallium zinc oxide film configured as the third conductive film and disposed on the buffer barrier layer, wherein an orthographic projection of the indium gallium zinc oxide film and an orthographic projection of the light shielding metal film are partially overlapped on the substrate; an interlayer insulation layer covering the indium gallium zinc oxide film and the buffer barrier layer, wherein the interlayer insulation layer has a second through hole and a third through hole, the second through hole communicates with the indium gallium zinc oxide film, and the third through hole communicates with the first through hole; a metal contact configured as the fourth conductive member and disposed on the interlayer insulation layer, wherein the metal contact is electrically connected to the indium gallium zinc oxide film through the second through hole; a metal diaphragm configured as the second conductive member and disposed on the interlayer insulation layer, wherein the metal diaphragm is electrically connected to the light shielding metal film through the third through hole and the first through hole, and an orthographic projection of the metal diaphragm and an orthographic projection of the indium gallium zinc oxide film are partially overlapped on the substrate; a passivation layer covering the interlayer insulation layer, the metal contact, and the metal diaphragm, wherein the passivation layer has a fourth through hole communicating with the metal contact; a planar layer disposed on the passivation layer, wherein the planar layer has a fifth through hole and a sixth through hole, the fifth through hole communicates with the fourth through hole, and the sixth through hole is located over the metal diaphragm; and a first transparent conductive film configured as the fifth conductive member, wherein the first transparent conductive film extends from the fifth through hole to the sixth through hole through the fourth through hole and a partial surface of the planar layer, and is electrically connected to the metal contact.

In an embodiment of the present disclosure, at least one thin film transistor is provided in the interlayer insulation layer and includes: an indium gallium zinc oxide layer disposed on the buffer barrier layer; a gate insulation layer disposed on the indium gallium zinc oxide layer; and a gate metal layer disposed on the gate insulation layer.

In an embodiment of the present disclosure, the interlayer insulation layer covers the indium gallium zinc oxide layer, the gate insulation layer, and the gate metal layer; and wherein the interlayer insulation layer has a seventh through hole and an eighth through hole, and the seventh through hole and the eighth through hole communicate with the indium gallium zinc oxide layer located on two sides of the gate insulation layer.

In an embodiment of the present disclosure, the backplane structure containing the capacitor further includes two metal electrode-plates disposed on the interlayer insulation layer, wherein the two metal electrode-plates are electrically connected to the indium gallium zinc oxide layer located on two sides of the gate insulation layer through the seventh through hole and the eighth through hole.

In an embodiment of the present disclosure, the passivation layer has a ninth through hole communicating with one of the two metal electrode-plates; and the planar layer has a tenth through hole communicating with the ninth through hole.

In an embodiment of the present disclosure, the backplane structure containing the capacitor further includes a second transparent conductive film, wherein the second transparent conductive film extends from the ninth through hole and the tenth through hole to a partial surface of the planar layer, and is electrically connected to one of the two metal electrode-plates.

The above backplane structure containing the capacitor of the present disclosure can form a three-layered capacitor structure, and the electrode-plates of the three-layered capacitor structure can utilize film layers which is used in the current process (such as a transparent conductive material with low resistivity), without adding a material film layer. It is only necessary to open a hole in the current film layers, no need to add photomasks and no need to introduce other processes. The three-layered capacitor structure is structured by the first conductive film, the second conductive member, the third conductive film, the fourth conductive member, and the fifth conductive member. Compared with the prior art, the above embodiments of the present disclosure can effectively reduce the area occupied by the capacitor under the premise of ensuring that the overall capacitance is constant, which is advantageous for further reducing the area of the pixel region, that can be used for preparing higher pixels per inch (PPI) display panels, risk of short circuit between the electrode-plates of the capacitor and wirings can be reduced, and yield can be improved.

DETAILED DESCRIPTION OF PREFERRED EMBODIMENTS

Following a description of the various embodiments refers to additional drawings for illustrating specific embodiments of the present disclosure. Furthermore, directional terms mentioned in the present disclosure, such as upper, lower, top, bottom, front, rear, left, right, inner, outer, side, surrounding, central, horizontal, lateral, vertical, longitudinal, axial, radial, uppermost or lowermost, etc., which only refer to the direction of drawings. Therefore, the directional terms used as above are for the purpose of illustration and understanding of the present disclosure, and are not intended to limit the present disclosure.

A backplane structure containing a capacitor of an embodiment of the present disclosure may be configured for a backplane containing indium gallium zinc oxide (IGZO), but be not limited thereto. The backplane structure containing the capacitor may further be configured for active matrix organic light emitting diodes (AMOLEDs) of a low temperature polysilicon (LTPS) backplane. For example, the backplane structure containing the capacitor may be configured to be disposed in a low temperature polysilicon backplane, the low temperature polysilicon backplane has at least one active matrix organic light emitting diode, for example, the low temperature polysilicon backplane contains N-type or P-type doped low temperature polysilicon. The following description only takes the backplane containing indium gallium zinc oxide (IGZO) as an example.

Figure 1:
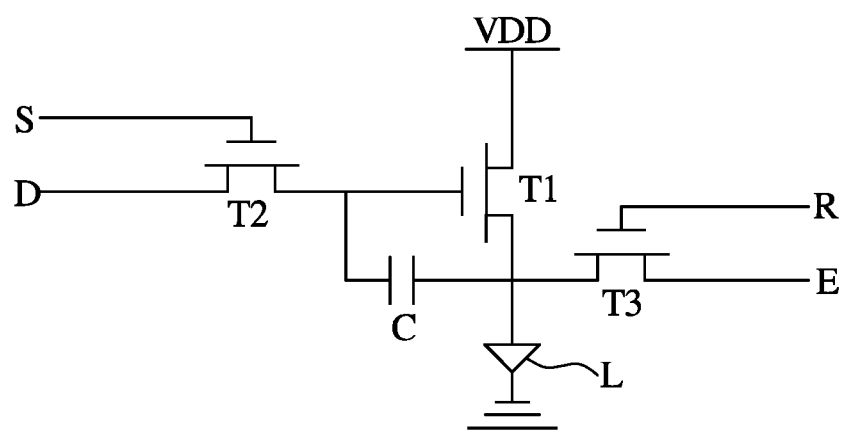
FIG. 1 is a schematic diagram illustrating a pixel driving circuit suitable for a backplane structure containing a capacitor according to an embodiment of the present disclosure.

For example, the backplane structure containing the capacitor can be applied to an AMOLED pixel driving circuit, such as a 3T1C type pixel driving circuit (as shown in FIG. 1), the 3T1C type pixel driving circuit may be structured of three transistors T1, T2, T3 and a capacitor C, with a direct current power supply VDD and a plurality of control signals S, D, R, E. A light emitting component (such as AMOLED) L can be driven to serve as a light source of a pixel of a display. The capacitor C may adopt the backplane structure containing the capacitor of the present disclosure as a storage capacitor for displaying signals.

Figure 2:
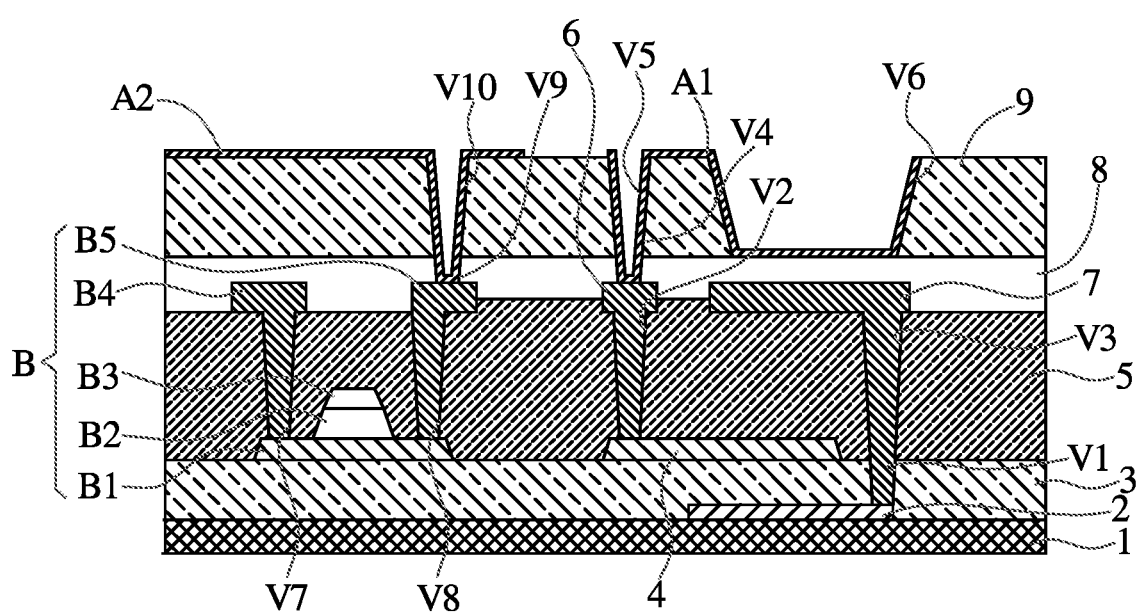
FIG. 2 is a schematic diagram illustrating a side cross-sectional view of the backplane structure containing the capacitor according to an embodiment of the present disclosure.

As shown FIG. 2, the backplane structure containing the capacitor of an embodiment of the present disclosure may include a substrate 1, a light shielding metal film 2, a buffer barrier layer 3, an indium gallium zinc oxide film 4, an interlayer insulation layer 5, a metal contact 6, a metal diaphragm 7, a passivation layer 8, a planar layer 9, and a first transparent conductive film A1, which are configured to construct the above transistors and capacitor (such as a capacitor with a three-layer structure) together. The following description describes implementations of the above embodiment, but is not limited thereto.

For example, as shown in FIG. 2, the light shielding metal film 2 may be configured as a first conductive film and be disposed on the substrate 1. The buffer barrier layer 3 can cover the substrate 1 and the light shielding metal film 2, wherein the buffer barrier layer 3 has a first through hole V1 communicating with the light shielding metal film 2. The indium gallium zinc oxide film 4 may be configured as a third conductive film and be disposed on the buffer barrier layer 3, wherein an orthographic projection of the indium gallium zinc oxide film 4 and an orthographic projection of the light shielding metal film 2 are partially overlapped on the substrate 1. The interlayer insulation layer 5 can cover the indium gallium zinc oxide film 4 and the buffer barrier layer 3, wherein the interlayer insulation layer 5 has a second through hole V2 and a third through hole V3, the second through hole V2 communicates with the indium gallium zinc oxide film 4, and the third through hole V3 communicates with the first through hole V1. The metal contact 6 may be configured as a fourth conductive member and be disposed on the interlayer insulation layer 5, wherein the metal contact 6 is electrically connected to the indium gallium zinc oxide film 4 through the second through hole V2. The metal diaphragm 7 may be configured as a second conductive member and be disposed on the interlayer insulation layer 5, wherein the metal diaphragm 7 is electrically connected to the light shielding metal film 2 through the third through hole V3 and the first through hole V1, and an orthographic projection of the metal diaphragm 7 and an orthographic projection of the indium gallium zinc oxide film 4 are partially overlapped on the substrate 1. The passivation layer 8 can cover the interlayer insulation layer 5, the metal contact 6, and the metal diaphragm 7, wherein the passivation layer 8 may has a fourth through hole V4 communicating with the metal contact 6. The planar layer 9 may be disposed on the passivation layer 8, wherein the planar layer 9 has a fifth through hole V5 and a sixth through hole V6, the fifth through hole V5 communicates with the fourth through hole V4, and the sixth through hole V6 is correspondingly located over the metal diaphragm 7. The first transparent conductive film A1 (such as indium tin oxide, ITO) may be configured as a fifth conductive member, wherein the first transparent conductive film A1 extends from the fifth through hole V4 to the sixth through hole V6 through the fourth through hole V4 and a partial surface of the planar layer 9, and is electrically connected to the metal contact 6. Thus, the first through hole V1, the second through hole V2, the three through hole V3, the fourth through hole V4, the fifth through hole V5, and the sixth through hole V6 may be configured as channels for electrical connection of different conductive materials through insulation materials.

In an embodiment, the backplane structure containing the capacitor further includes a thin film transistor B, the thin film transistor B may be disposed on the buffer barrier layer 3 and be provided in the interlayer insulation layer 5. For example, the thin film transistor B may include an indium gallium zinc oxide layer B1, a gate insulation layer B2, and a gate metal layer B3. The indium gallium zinc oxide layer B1 is disposed on the buffer barrier layer 3, the gate insulation layer B2 is disposed on the indium gallium zinc oxide layer B1, and the gate metal layer B3 is disposed on the gate insulation layer B2, but are not limited thereto, the thin film transistor may further construct as other structures. Thus, they can be applied to manufacture a part of structures of thin film transistors in the AMOLED pixel driving circuit.

In an embodiment, the interlayer insulation layer 5 can cover the indium gallium zinc oxide layer 1, the gate insulation layer B2, and the gate metal layer B2, wherein the interlayer insulation layer 5 has a seventh through hole V7 and an eighth through hole V8, and the seventh through hole V7 and the eighth through hole V8 communicate with the indium gallium zinc oxide layer B1 located on two sides of the gate insulation layer B2, thereby being used to manufacture the other structures of the thin film transistors in the pixel driving circuit for the AMOLED. For example, the backplane structure containing the capacitor further includes two metal electrode-plates B4 and B5 disposed on the interlayer insulation layer 5, wherein the two metal electrode-plates B4 and B5 are electrically connected to the indium gallium zinc oxide layer B1 located on two sides of the gate insulation layer B3 through the seventh through hole V7 and the eighth through hole V8. Thus, the seventh through hole V7 and the eighth through hole V8 may be configured as channels for electrical connection of different conductive materials through insulation materials.

In an embodiment, the passivation layer 8 may have a ninth through hole V9 communicating with one of the two metal electrode-plates B4 and B5. The planar layer 9 may have a tenth through hole V10 communicating with the ninth through hole V9. Thus, the ninth through hole V9 and the tenth through hole V10 may be configured as channels for electrical connection of different conductive materials through insulation materials.

In an embodiment, the backplane structure containing the capacitor further includes a second transparent conductive film A2 (such as ITO), wherein the second transparent conductive film A2 extends from the ninth through hole V9 and the tenth through hole V10 to a partial surface of the planar layer 9, and is electrically connected to one of the two metal electrode-plates B4 and B5. The second transparent conductive film A2 and the first transparent conductive film A1 may be connected. Alternatively, The second transparent conductive film A2 and the first transparent conductive film A1 may be disconnected, in order to meet an actual circuit requirements.

Figure 3:
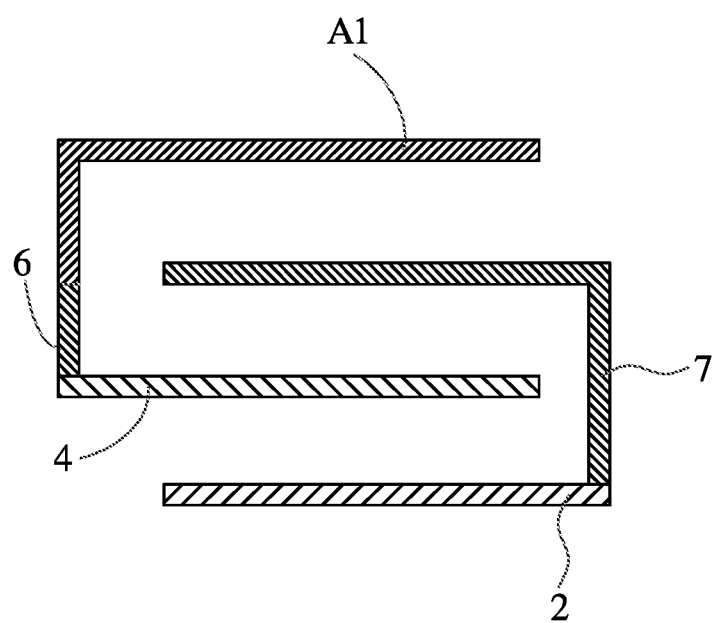
FIG. 3 is a schematic diagram illustrating a three-layer capacitor structure of the backplane structure containing the capacitor according to an embodiment of the present disclosure.

As shown in FIG. 3, the backplane structure containing the capacitor in an embodiment of the present disclosure may use the light shielding metal film 2 and the metal diaphragm 7 to form a first recess-shaped structure, and use the indium gallium zinc oxide film 4, the metal contact 6, and the first transparent conductive film A1 to form a second recess-shaped structure. The first recess-shaped structure and the second recess-shaped structure form a sandwich structure with each other. For example, a pardon of the metal diaphragm 7 of the first recess-shaped structure is located between the indium gallium zinc oxide film 4 and the first transparent conductive film A1 both of the second recess-shaped structure. A portion of the indium gallium zinc oxide film 4 of the second recess-shaped structure is located between the light shielding metal film 2 and the metal diaphragm 7 both of the first recess-shaped structure. Each of the light shielding metal film 2, the indium gallium zinc oxide film 4, and the metal diaphragm 7 are parallel to at least one portion of the first transparent conductive film A1, and the light shielding metal film 2, the indium gallium zinc oxide film 4, the metal diaphragm 7, and at least one portion of the first transparent conductive film A1 are insulated from each other, to form electrode-plates of a three-layered capacitor.

In general, as shown in FIGS. 2 and 3, the backplane structure containing the capacitor of the above embodiments of the present disclosure may include: a substrate 1; a first conductive film (such as the light shielding metal film 2) disposed on the substrate; a second conductive member (such as the metal diaphragm 7) having two portions connected to each other, wherein one of the two portions of the second conductive member is spaced apart from the first conductive film, and the other of the two portions of the second conductive member is connected to the first conductive film; a third conductive film (such as the indium gallium zinc oxide film 4) spaced apart from the first conductive film and the second conductive member; a fourth conductive member (such as the metal contact 6), connected to the third conductive film; and a fifth conductive member (such as the first transparent conductive film A1) having two portions connected to each other, wherein one of the two portions of the fifth conductive member is connected to the fourth conductive member, and the other of the two portions of the fifth conductive member is spaced apart from the second conductive member; wherein the third conductive film is disposed between the first conductive film and the second conductive member in an insulation manner, and the second conductive member is disposed between the third conductive film, the fourth conductive member, and the fifth conductive member in an insulation manner.

In an embodiment, orthographic projections of the first conductive film, the second conductive member, the third conductive film, and the fifth conductive member are partially overlapped on the substrate. For example, as shown in FIG. 2, orthographic projections of the light shielding metal film 2, the indium gallium zinc oxide film 4, the metal diaphragm 7, and the first transparent conductive film A1 are partially overlapped on the substrate 1.

Figure 4:
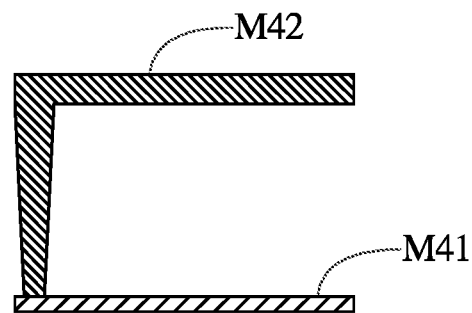
FIG. 4 is a schematic diagram illustrating a single-layer capacitor structure.
Figure 5:
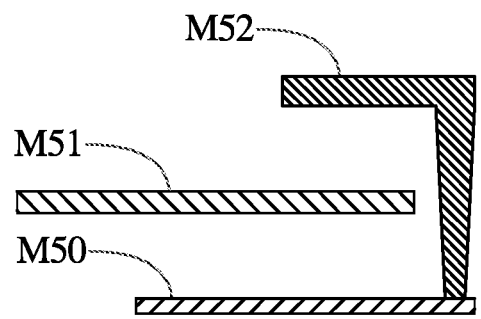
FIG. 5 is a schematic diagram illustrating a double-layer capacitor structure.

Please refer to FIG. 3 again, the light shielding metal film 2, the indium gallium zinc oxide film 4, the metal diaphragm 7, and the first transparent conductive film A1 of the backplane structure containing the capacitor of the above embodiments of the present disclosure can be configured to a plurality of electrode-plates of the three-layered capacitor structure. Compared with other capacitors having a larger area, such as a single-layered capacitor structured of two metal films M41 and M42 (as shown in FIG. 4), or a double-layered capacitor structured of three metal films M50, M51, and M52 (as shown in FIG. 5), the three-layered capacitor configuration of the above embodiments of the present disclosure can increase a number of electrode-plates in which the projection overlapping portions are parallel to each other and apart from each other in a insulation manner, thereby increasing a total surface area of the electrode-plates, so that amount of charge that can be stored per unit area is increased. In a case of a fixed capacitance specification, the area of the capacitor can be effectively reduced, which is advantageous for further reducing the area of a pixel region, that can be used for preparing higher pixels per inch (PPI) display panels.

It should be noted that, the backplane structure containing the capacitor of the above embodiments of the present disclosure does not need to add new material film layers, and only needs to have openings in the current film layers, so that no new photomasks are needed when manufacturing, thereby there is no need to introduce other processes. If indium gallium zinc oxide (IGZO) is used as electrode-plates of the capacitor, risk of short circuiting between the electrode-plates of the capacitor and wirings can be reduced, and yield can be improved.

Therefore, the backplane structure containing the capacitor of the above embodiments of the present disclosure can form a three-layered capacitor structure, and the electrode-plates of the three-layered capacitor structure can utilize film layers which is used in the current process (such as a transparent conductive material with low resistivity), without adding a material film layer. It is only necessary to open a hole in the current film layers, no need to add photomasks and no need to introduce other processes. The three-layered capacitor structure is structured by the first conductive film, the second conductive member, the third conductive film, the fourth conductive member, and the fifth conductive member. Compared with the prior art, the above embodiments of the present disclosure can effectively reduce the area occupied by the capacitor under the premise of ensuring that the overall capacitance is constant, which is advantageous for further reducing the area of the pixel region, that can be used for preparing the higher pixels per inch (PPI) display panels, risk of short circuit between the electrode-plates of the capacitor and wirings can be reduced, and yield can be improved.

The present disclosure has been described by the above related embodiments, but the above embodiments are merely examples for implementing the present disclosure. It must be noted that, the disclosed embodiments do not limit the scope of the present disclosure. Rather, the scope of the present disclosure includes modifications and equivalent arrangements involved in spirit and scope of claims.

What is claimed is:

1. A backplane structure containing a capacitor, comprising:
    a substrate;
    a first conductive film disposed on the substrate;
    a second conductive member having two portions connected to each other, wherein one of the two portions of the second conductive member is spaced apart from the first conductive film, and the other of the two portions of the second conductive member is connected to the first conductive film;
    a third conductive film spaced apart from the first conductive film and the second conductive member;
    a fourth conductive member connected to the third conductive film;
    a fifth conductive member having two portions connected to each other, wherein one of the two portions of the fifth conductive member is connected to the fourth conductive member, and the other of the two portions of the fifth conductive member is spaced apart from the second conductive member;
    a light shielding metal film configured as the first conductive film and disposed on the substrate;
    a buffer barrier layer covering the substrate and the light shielding metal film, wherein the buffer barrier layer has a first through hole communicating with the light shielding metal film;
    an indium gallium zinc oxide film configured as the third conductive film and disposed on the buffer barrier layer, wherein an orthographic projection of the indium gallium zinc oxide film and an orthographic projection of the light shielding metal film are partially overlapped on the substrate;
    an interlayer insulation layer covering the indium gallium zinc oxide film and the buffer barrier layer, wherein the interlayer insulation layer has a second through hole and a third through hole, the second through hole communicates with the indium gallium zinc oxide film, and the third through hole communicates with the first through hole;
    a metal contact configured as the fourth conductive member and disposed on the interlayer insulation layer, wherein the metal contact is electrically connected to the indium gallium zinc oxide film through the second through hole;
    a metal diaphragm configured as the second conductive member and disposed on the interlayer insulation layer, wherein the metal diaphragm is electrically connected to the light shielding metal film through the third through hole and the first through hole, and an orthographic projection of the metal diaphragm and an orthographic projection of the indium gallium zinc oxide film are partially overlapped on the substrate;
    a passivation layer covering the interlayer insulation layer, the metal contact, and the metal diaphragm, wherein the passivation layer has a fourth through hole communicating with the metal contact;
    a planar layer disposed on the passivation layer, wherein the planar layer has a fifth through hole and a sixth through hole, the fifth through hole communicates with the fourth through hole, and the sixth through hole is located over the metal diaphragm; and
    a first transparent conductive film configured as the fifth conductive member, wherein the first transparent conductive film extends from the fifth through hole to the sixth through hole through the fourth through hole and a partial surface of the planar layer, and is electrically connected to the metal contact;
    wherein the third conductive film is disposed between the first conductive film and the second conductive member in an insulation manner, and the second conductive member is disposed between the third conductive film and the fifth conductive member in an insulation manner, to form a three-layered capacitance structure; and
    wherein orthographic projections of the first conductive film, the second conductive member, the third conductive film, and the fifth conductive member are partially overlapped on the substrate.

2. The backplane structure containing the capacitor as claimed in claim 1, the backplane structure being disposed in a low temperature polysilicon backplane, which has at least one active matrix organic light emitting diode.

3. The backplane structure containing the capacitor as claimed in claim 2, wherein the low temperature polysilicon backplane contains N-type or P-type doped low temperature polysilicon.

4. The backplane structure containing the capacitor as claimed in claim 1, wherein at least one thin film transistor is provided in the interlayer insulation layer and comprises:
    an indium gallium zinc oxide layer disposed on the buffer barrier layer;
    a gate insulation layer disposed on the indium gallium zinc oxide layer; and
    a gate metal layer disposed on the gate insulation layer.

5. The backplane structure containing the capacitor as claimed in claim 4, wherein the interlayer insulation layer covers the indium gallium zinc oxide layer, the gate insulation layer, and the gate metal layer; and wherein the interlayer insulation layer has a seventh through hole and an eighth through hole, and the seventh through hole and the eighth through hole communicate with the indium gallium zinc oxide layer located on two sides of the gate insulation layer.

6. The backplane structure containing the capacitor as claimed in claim 5, further comprising two metal electrode-plates disposed on the interlayer insulation layer, wherein the two metal electrode-plates are electrically connected to the indium gallium zinc oxide layer located on two sides of the gate insulation layer through the seventh through hole and the eighth through hole.

7. The backplane structure containing the capacitor as claimed in claim 6, wherein the passivation layer has a ninth through hole communicating with one of the two metal electrode-plates; and the planar layer has a tenth through hole communicating with the ninth through hole.

8. The backplane structure containing the capacitor as claimed in claim 7, further comprising a second transparent conductive film, wherein the second transparent conductive film extends from the ninth through hole and the tenth through hole to a partial surface of the planar layer, and is electrically connected to one of the two metal electrode-plates.

9. A backplane structure containing a capacitor, comprising:
a substrate;
a first conductive film disposed on the substrate;
a second conductive member having two portions connected to each other, wherein one of the two portions of the second conductive member is spaced apart from the first conductive film, and the other of the two portions of the second conductive member is connected to the first conductive film;
a third conductive film spaced apart from the first conductive film and the second conductive member;
a fourth conductive member connected to the third conductive film;
a fifth conductive member having two portions connected to each other, wherein one of the two portions of the fifth conductive member is connected to the fourth conductive member, and the other of the two portions of the fifth conductive member is spaced apart from the second conductive member;
a light shielding metal film configured as the first conductive film and disposed on the substrate;
a buffer barrier layer covering the substrate and the light shielding metal film, wherein the buffer barrier layer has a first through hole communicating with the light shielding metal film;
an indium gallium zinc oxide film configured as the third conductive film and disposed on the buffer barrier layer, wherein an orthographic projection of the indium gallium zinc oxide film and an orthographic projection of the light shielding metal film are partially overlapped on the substrate;
an interlayer insulation layer covering the indium gallium zinc oxide film and the buffer barrier layer, wherein the interlayer insulation layer has a second through hole and a third through hole, the second through hole communicates with the indium gallium zinc oxide film, and the third through hole communicates with the first through hole;
a metal contact configured as the fourth conductive member and disposed on the interlayer insulation layer, wherein the metal contact is electrically connected to the indium gallium zinc oxide film through the second through hole;
a metal diaphragm configured as the second conductive member and disposed on the interlayer insulation layer, wherein the metal diaphragm is electrically connected to the light shielding metal film through the third through hole and the first through hole, and an orthographic projection of the metal diaphragm and an orthographic projection of the indium gallium zinc oxide film are partially overlapped on the substrate;
a passivation layer covering the interlayer insulation layer, the metal contact, and the metal diaphragm, wherein the passivation layer has a fourth through hole communicating with the metal contact;
a planar layer disposed on the passivation layer, wherein the planar layer has a fifth through hole and a sixth through hole, the fifth through hole communicates with the fourth through hole, and the sixth through hole is located over the metal diaphragm; and
a first transparent conductive film configured as the fifth conductive member, wherein the first transparent conductive film extends from the fifth through hole to the sixth through hole through the fourth through hole and a partial surface of the planar layer, and is electrically connected to the metal contact;
wherein the third conductive film is disposed between the first conductive film and the second conductive member in an insulation manner, and the second conductive member is disposed between the third conductive film and the fifth conductive member in an insulation manner.

10. The backplane structure containing the capacitor as claimed in claim 9, wherein orthographic projections of the first conductive film, the second conductive member, the third conductive film, and the fifth conductive member are partially overlapped on the substrate.

11. The backplane structure containing the capacitor as claimed in claim 9, the backplane structure being disposed in a low temperature polysilicon backplane, which has at least one active matrix organic light emitting diode.

12. The backplane structure containing the capacitor as claimed in claim 11, wherein the low temperature polysilicon backplane contains N-type or P-type doped low temperature polysilicon.

13. The backplane structure containing the capacitor as claimed in claim 9, wherein at least one thin film transistor is provided in the interlayer insulation layer and comprises:
an indium gallium zinc oxide layer disposed on the buffer barrier layer;
a gate insulation layer disposed on the indium gallium zinc oxide layer; and
a gate metal layer disposed on the gate insulation layer.

14. The backplane structure containing the capacitor as claimed in claim 13, wherein the interlayer insulation layer covers the indium gallium zinc oxide layer, the gate insulation layer, and the gate metal layer; and wherein the interlayer insulation layer has a seventh through hole and an eighth through hole, and the seventh through hole and the eighth through hole communicate with the indium gallium zinc oxide layer located on two sides of the gate insulation layer.

15. The backplane structure containing the capacitor as claimed in claim 14, further comprising two metal electrode-plates disposed on the interlayer insulation layer, wherein the two metal electrode-plates are electrically connected to the indium gallium zinc oxide layer located on two sides of the gate insulation layer through the seventh through hole and the eighth through hole.

16. The backplane structure containing the capacitor as claimed in claim 15, wherein the passivation layer has a ninth through hole communicating with one of the two metal electrode-plates; and the planar layer has a tenth through hole communicating with the ninth through hole.

17. The backplane structure containing the capacitor as claimed in claim 16, further comprising a second transparent conductive film, wherein the second transparent conductive film extends from the ninth through hole and the tenth through hole to a partial surface of the planar layer, and is electrically connected to one of the two metal electrode-plates.

* * * * *